United States Patent [19]
Kuster

[11] Patent Number: 5,368,643
[45] Date of Patent: Nov. 29, 1994

[54] COATING APPARATUS FOR BOARDS

[75] Inventor: Kaspar Kuster, Basel, Switzerland

[73] Assignee: Ciba-Geigy Corporation, Ardsley, N.Y.

[21] Appl. No.: 973,479

[22] Filed: Nov. 9, 1992

[30] Foreign Application Priority Data

Nov. 13, 1991 [DE] Germany .............. 91810879

[51] Int. Cl.⁵ ............................................ B05B 13/02
[52] U.S. Cl. ....................... 118/324; 118/DIG. 4; 198/345.1; 198/456; 198/626.5; 198/817; 271/238; 271/240; 271/253; 271/273
[58] Field of Search ............ 118/324, DIG. 4; 271/238, 240, 253, 254, 273; 198/339.1, 345.1, 456, 817, 626.5

[56] References Cited

U.S. PATENT DOCUMENTS

| 3,595,369 | 7/1971 | Boulay et al. | 198/626.5 X |
|---|---|---|---|
| 3,645,375 | 2/1972 | Gelzer | 198/339.1 |
| 4,542,820 | 9/1985 | Maxner | 198/817 |
| 4,767,116 | 8/1988 | Eberle | 198/456 X |
| 4,922,851 | 5/1990 | Morikawa et al. | 118/324 |
| 5,029,696 | 7/1991 | Van Tilburg | 198/626.1 |
| 5,113,701 | 5/1992 | Martin | 118/58 |

FOREIGN PATENT DOCUMENTS 0393796 10/1990 European Pat. Off.
0441743 8/1991 European Pat. Off.

Primary Examiner—David A. Simmons
Assistant Examiner—Paul M. Rivard
Attorney, Agent, or Firm—William A. Teoli, Jr.

[57] ABSTRACT

A board to be coated is conveyed by means of first transport means in the form of a roller conveyor to a curtain coating device. The latter comprises second transport means in the form of two conveyor belts, each of which runs round an associated straightening bar in the direction of transport of the board. The straightening bars are movable and as they move towards one another they align the boards at the side edges thereof in such a manner that the side edges extend approximately parallel to the direction of transport of the board. Conical rollers are connected to the straightening bars. During alignment, that is to say, when the straightening bars are moved towards one another, the board to be coated is at the same time lifted from the roller conveyor by means of the conical rollers and conveyed via the surfaces of the conical rollers to the conveyor belts. The latter engage laterally at the board edges and transport the board through a pouring curtain for the purpose of coating.

11 Claims, 6 Drawing Sheets

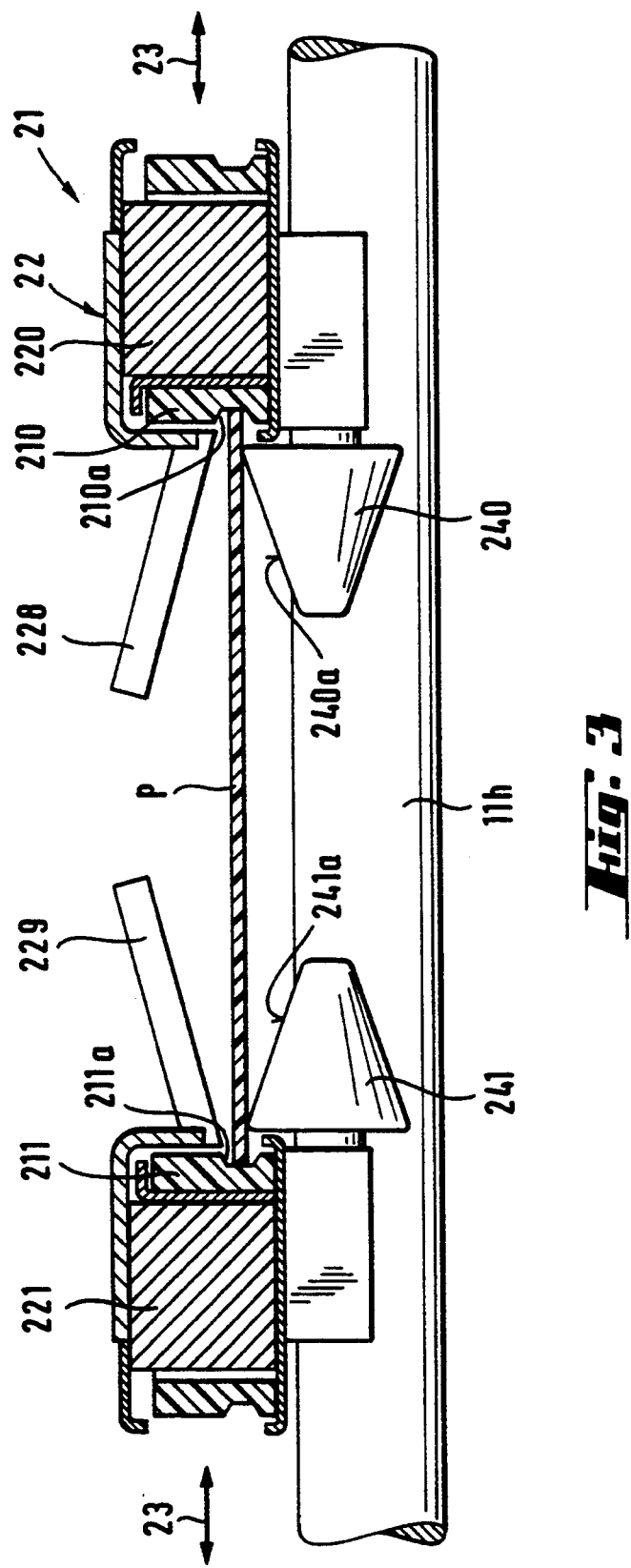

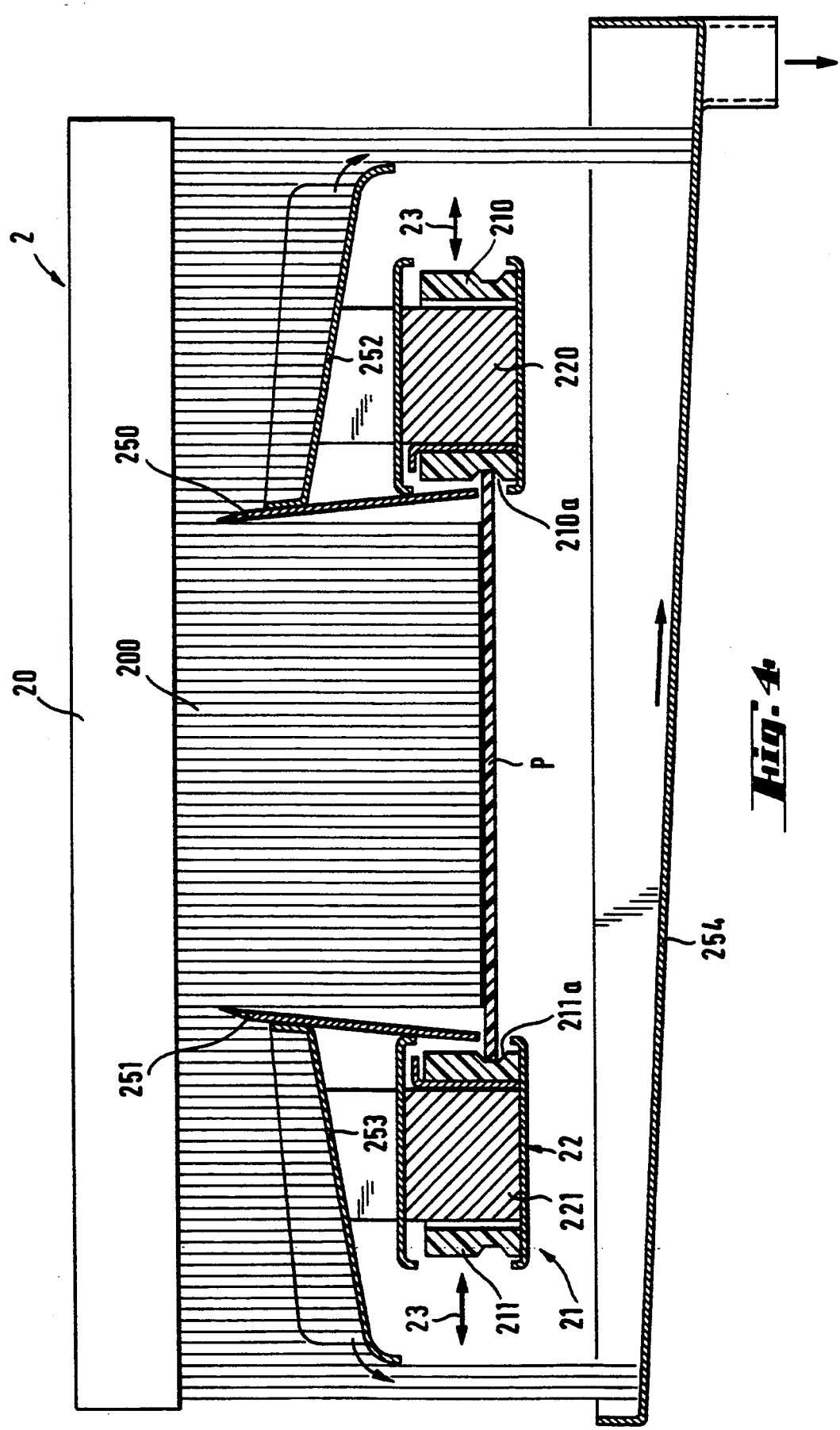

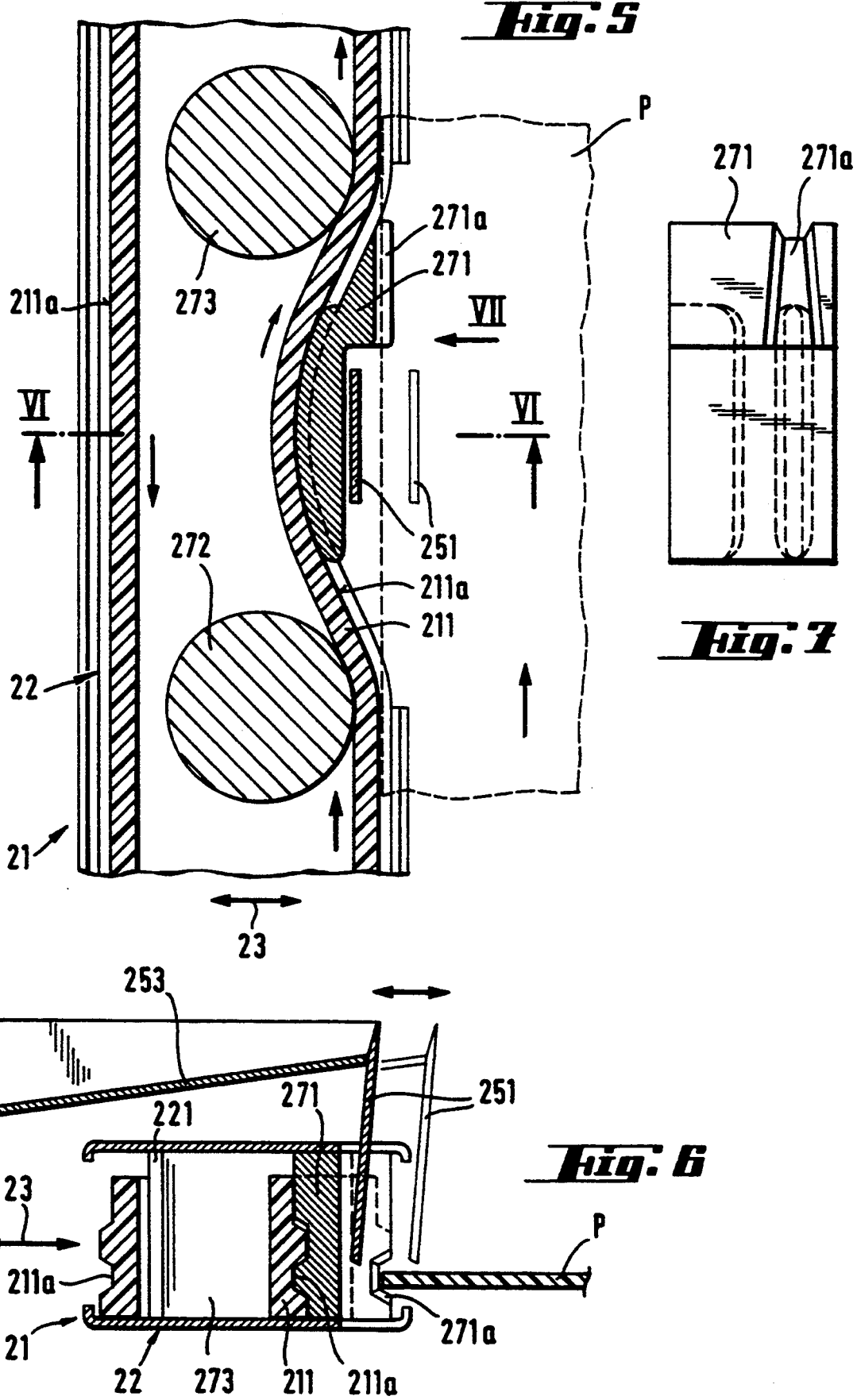

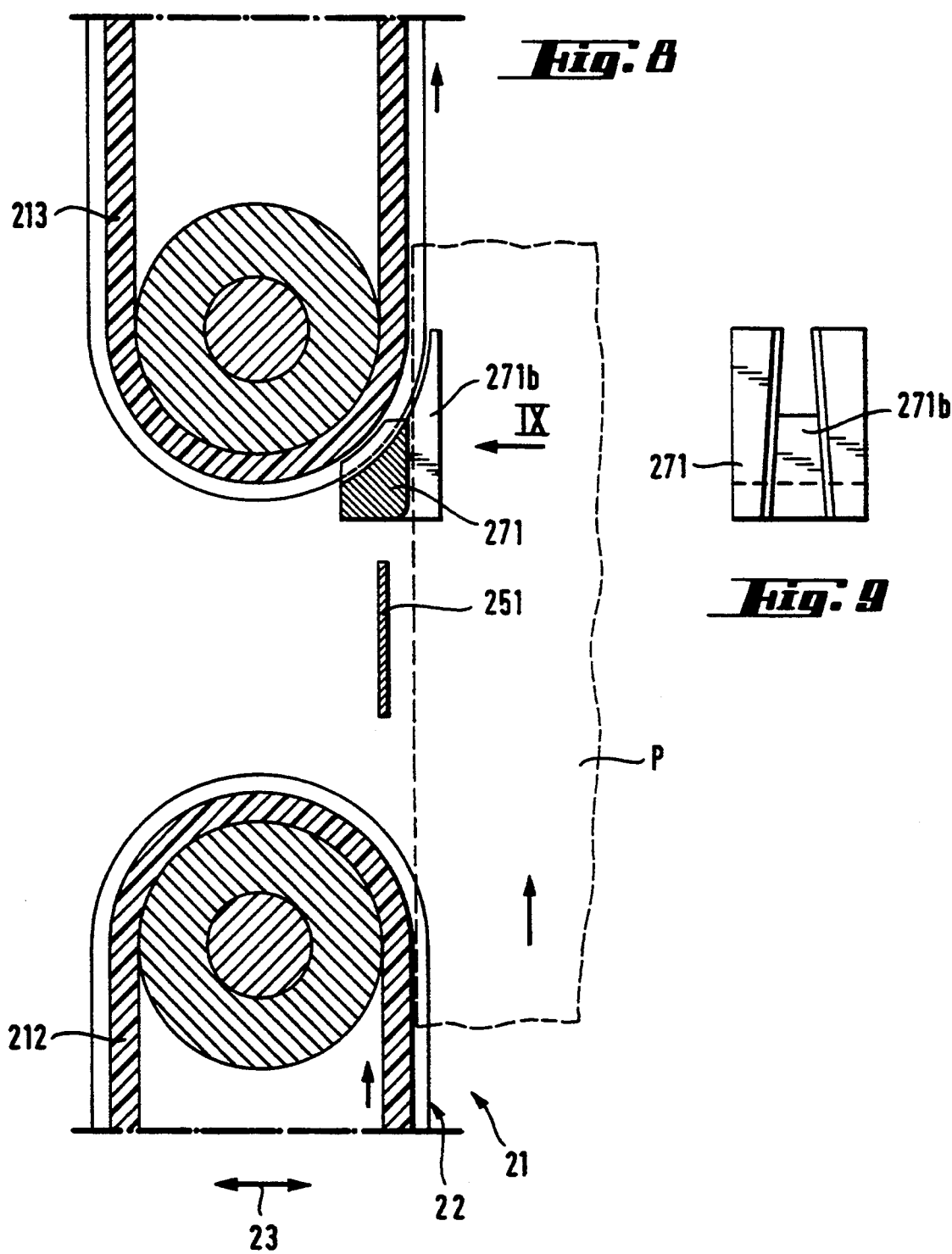

COATING APPARATUS FOR BOARDS

The invention relates to a coating apparatus according to the preamble of the independent patent claim.

BACKGROUND OF THE INVENTION

Coating apparatuses for boards or board-shaped workpieces are known in various forms and are used especially in the coating of printed circuit boards (for example with solder resist, etc.). Such a coating apparatus and its basic method of functioning are described, for example, in EP-A-145 648. The board to be coated is passed under a pouring curtain which falls from a curtain pouring head. The pouring head is so arranged that the falling pouring curtain strikes the board along a line of impact extending transversely to the direction of transport of the board. By continuous advance of the board under the pouring curtain the board is in that manner coated.

In addition, a transport apparatus for such printed circuit boards to be coated is known from EP-A-312 498. There, the boards to be coated are first so aligned in a feed station using rake-like aligning means that, thereafter, the board edges are arranged approximately parallel to the direction of transport of the board. The board aligned in that manner is conveyed by means of first transport means, which are in this case in the form of a feed roller conveyor, to a curtain coating device of the type described above. In the curtain coating device are provided two transport means that pass the boards to be coated under the pouring curtain as soon as the entire board to be coated has entered the coating device.

The reason for the necessity for two transport means is that the boards have to be passed under the pouring curtain at a greater speed than that at which they enter the curtain coating device from the feed station. The speed at which the boards are passed under the pouring curtain depends on several factors, but especially on the type of coating composition (for example resist) and on the height from which the curtain falls. The fact that the transport speed in the curtain coating device is greater than the feed speed also ensures that there is a certain time buffer between two consecutive boards.

The apparatuses described are functionally efficient devices per se but still have disadvantages. For example, in the case of the devices described, it is necessary to align the boards in two separate operations and to transfer the aligned boards to the curtain coating device. That is first of all complicated, that is to say, two separate devices are required, on the one hand aligning means (for example the rake described above) and, on the other, means for transferring the boards to the second transport means. Secondly, such means also require a certain mount of space which, in an age of progressive size reduction, is in increasingly short supply (and expensive besides).

Other disadvantages of already existing devices reside also in the fact that the boards in the curtain coating device lie on conveyor belts and, resting on those belts, are transported through the pouring curtain, as a result of which the quality of the contact face may be impaired. Problems may therefore arise during transport of the board through the curtain because the conveyor belts, on both sides of the curtain, extend only to just short of the curtain so that the falling curtain cannot fall on the conveyor belts during the coating operation. If the board to be coated is not quite flat, problems may arise as the board passes from the one belt, which extends to just upstream of the curtain, onto the belt that begins just downstream of the curtain, because the board is not flat. Furthermore, the conveyor belts can still be soiled comparatively easily, for example, when the leading board edge breaks through the pouring curtain and coating composition is "pushed" by the edge onto the conveyor belt or passes onto the conveyor belt through drill-holes in a blank.

SUMMARY OF THE INVENTION

The problem of the invention is accordingly to propose a coating apparatus that on the one hand minimizes the space requirement of such apparatuses and, on the other, permits reliable alignment and transfer of the boards to the curtain coating device or to the second transport means provided therein. It is also desirable for the board to be transported, if possible, without further transfers during the coating operation and, in addition, as smoothly as possible through the pouring curtain, and furthermore for soiling of the transport means to be avoided as far as possible.

That problem is solved according to the invention in that the aligning means are in such a form and are so arranged that, as they align the boards, they transfer them from the first transport means directly to the second transport means. In that manner, two operating steps are carried out together so that the space requirement is markedly smaller than in the case of known apparatuses. At the same time, the board to be coated is reliably transferred to the second transport means which convey the board through the pouring curtain.

In an advantageous arrangement, the aligning means comprise two straightening members that are arranged laterally approximately parallel to the direction of transport of the boards. Those straightening members can be moved towards or away from one another substantially perpendicular to the direction of transport and, as they move towards one another, they align the board at its edges. That arrangement is particularly simple and particularly effective. In a further development of that arrangement, the straightening members can be moved towards or away from one another symmetrically.

The straightening members are advantageously connected to transfer means, each of which defines an inclined plane. That inclined plane extends substantially between a first transport plane defined by the first transport means and a second transport plane defined by the second transport means. The second transport plane extends substantially parallel to the first transport plane and above that plane. The transfer means lift the boards from the first transport means and transfer them via the inclined plane to the second transport means. On the one hand the transfer process is thus simple and reliable and, on the other, the transport speeds of the first and second transport means are generally different, that is to say, the transport speed of the second transport means, which convey the board to be coated through the pouring curtain, is greater. As a result of the separation into two different transport planes and as a result of the reliable transfer of the board, transfer from one transport means to the other does not present any difficulties.

In one arrangement of the invention, the transfer means comprise free-running conical rollers that are arranged in the region in which the boards coming from the first transport means enter between the straightening members. They are so arranged along the straightening members that the roller axes extend parallel to the direction of movement of the straightening members, so that the straightening members, by their movement towards one another, move the boards via the conical rollers (inclined plane) and transfer them to the second transport means.

In a variant of the invention, the straightening members comprise straightening bars and the second transport means comprise drivable conveyor belts. Each of the conveyor belts is arranged in the direction of transport to run round its associated straightening bar, the plane of each conveyor belt extending substantially perpendicular to the transport plane of the board, that is to say, the conveyor belts engage at the side edges of the boards when the latter are being transported. In a simple manner, the conveyor belts may comprise a longitudinal groove in which the conveyor belt engages at the associated side edge of the board.

In an advantageous arrangement, the force with which the conveyor belts engage at the side edges of the boards is adjustable, for example by means of an adjustable hydraulic/pneumatic system.

Another arrangement of the invention is distinguished by the connection to the straightening members of limiting members for the lateral delimitation of the pouring curtain, which limiting members can be displaced together with the straightening members. By this means it is possible for the effective width of the pouring curtain through which the board is conveyed to be matched to the width of the board, which is to be coated, at the same time as the board is aligned and transported. Advantageously, the limiting members for the lateral delimitation of the pouring curtain are so arranged that the failing pouring curtain does not strike the boards in a narrow border region near the side edge of the board, at which, of course, the conveyor belts engage. As a result, the boards can be further transported supported on their side borders without the coating composition or the resist being damaged, even in cases where the boards are coated on both sides. For example, they can be further transported on a V-shaped roller conveyor. Furthermore, with that type of transport, the conveyor belts remain free of soiling by the coating composition. The limiting members may be formed by pouring blades known per se which are secured to the straightening members.

In a further arrangement of the invention, the limiting members (pouring blades) for the lateral delimitation of the pouring curtain are so arranged that the falling pouring curtain strikes the board over its entire width. That can be effected, for example, by arranging in the region of the failing pouring curtain a deflecting device which, a short distance upstream of the pouring curtain, viewed in the direction of transport, guides the conveyor belts outwards and away from the side edges of the board, around the deflecting device. A short distance downstream of the pouring curtain, they are then guided back again to the side edges of the board.

In another arrangement of the invention, the second transport means comprise a support belt that is arranged in the direction of transport approximately in the second transport plane defined by the second transport means. The support belt extends in such a manner that relatively large boards that sag in the middle are supported by that additional belt. The straightening members can be displaced towards or away from one another symmetrically in relation to that conveyor belt.

BRIEF DESCRIPTION OF THE DRAWINGS

The invention is explained in more detail in the following with reference to the drawings, some of which are schematic.

FIG. 3 is a detail of a cut-out portion III of the transfer means and the second transport means of FIG. 2, and FIG. 4 is a detail of the curtain coating device of the coating apparatus according to the invention, FIG. 5 shows another embodiment of the curtain coating device having a deflecting device in the region of the pouring curtain, FIG. 6 is a section along the line VI—VI of FIG. 5, FIG. 7 shows the deflecting device of FIG. 5, FIG. 8 shows a further embodiment of the curtain coating device of the coating apparatus according to the invention, FIG. 9 is a detail IX of FIG. 8.

DETAILED DESCRIPTION OF THE INVENTION

Figure 1:
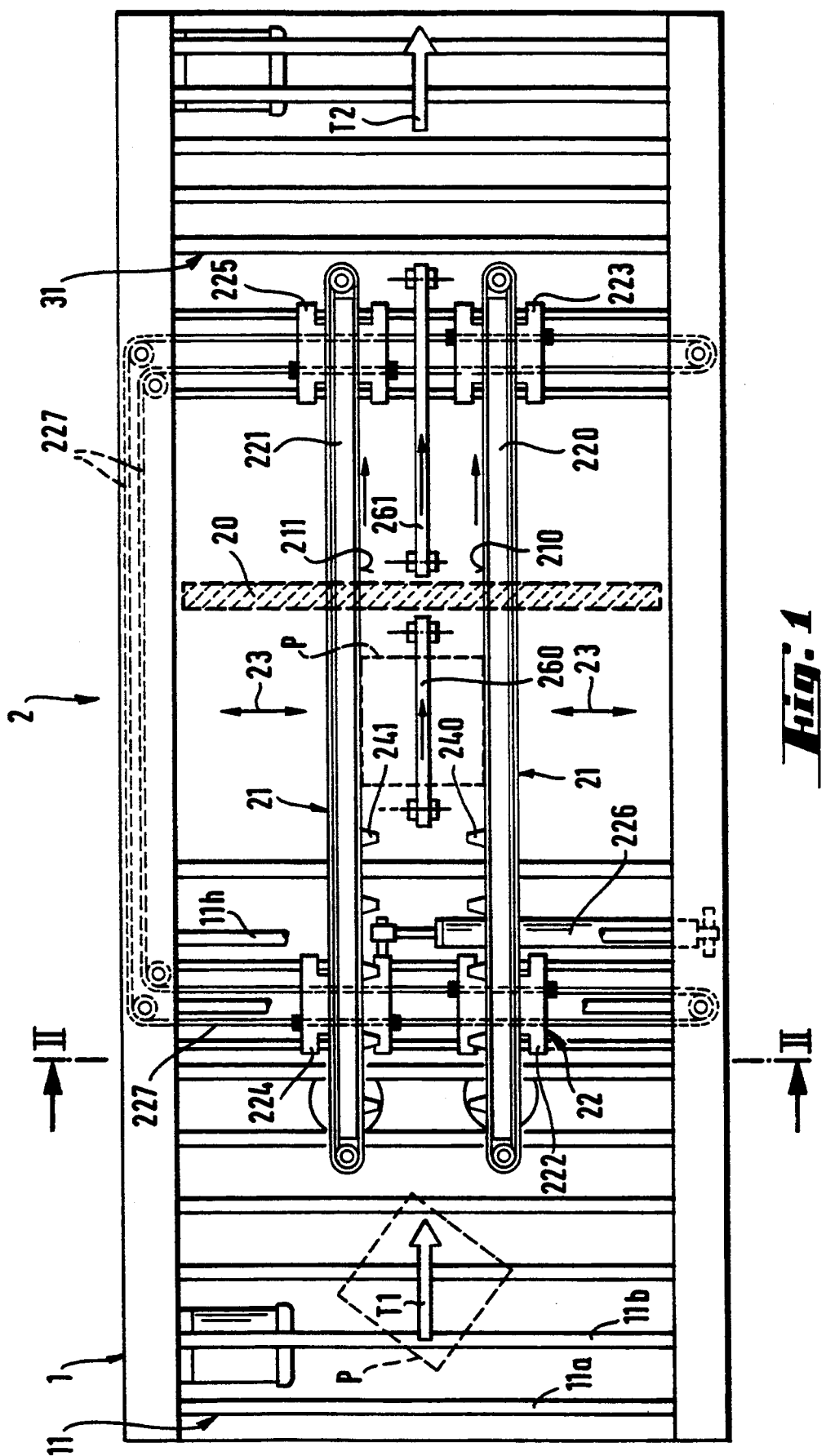
FIG. 1 is a plan view of an embodiment of the coating apparatus according to the invention.

The embodiment shown in FIG. 1 of the coating apparatus according to the invention comprises first transport means 1, in this case in the form of the roller conveyor 11, of which only the rollers 11a and 11b are provided with reference numerals. The first transport means transport a board P to be coated, shown by a broken line in FIG. 1, in the direction of arrow T1 to a curtain coating device 2. The curtain coating device 2 comprises a curtain pouring head 20, shown by a broken line, second transport means 21, shown in the detail in FIG. 3, and aligning means 22 that align the board P at its edges approximately parallel to the direction of transport. The second transport means 21 transport the aligned board P, for example a printed circuit board, through a pouring curtain 200 (FIG. 4) falling from the curtain pouring head 20. The board P coated in that manner can then be conveyed in the direction of arrow T2, for example on a roller conveyor 31, to a drying device (not shown).

The coating apparatus functions roughly as follows: a printed circuit board P that is to be coated, for example with a UV-hardenable solder resist, is conveyed on the roller conveyor 11, of which the rollers are drivable, in the direction of arrow T1. The printed circuit board can rest in a slanting manner on the roller conveyor 11, as shown in FIG. 1. When the printed circuit board P reaches the curtain coating device 2, the aligning means 22 are moved inwards from their starting position (tight at the outside) (not shown for reasons of draughtmanship) in accordance with the arrows 23. The aligning means 22 comprise essentially two straightening members, in the form of straightening bars 220 and 221, which align the edges of the board P approximately parallel to the direction of transport. That alignment of the board edges is effected by the movement of the two straightening bars 220 and 221 towards one another, that is to say, the straightening bars 220 and 221 can be moved towards one another approximately perpendicular to the direction of transport of the board P. The straightening bars 220 and 221 can be seen in FIG. 1 in the position in which they have been moved together. At the same time as it is being aligned, the board P is lifted upwards from the roller conveyor 11 and transferred to the second transport means 21. The details of how that transfer process is effected will be explained more precisely with reference to FIG. 2 and FIG. 3. The board P is then coated in the curtain coating device 2. When the coated board P has left the coating device and is on the roller conveyor 31, the straightening bars 220 and 221 are moved away from each other again in the direction of arrows 23, that is to say, back to their starting position.

Figure 2:
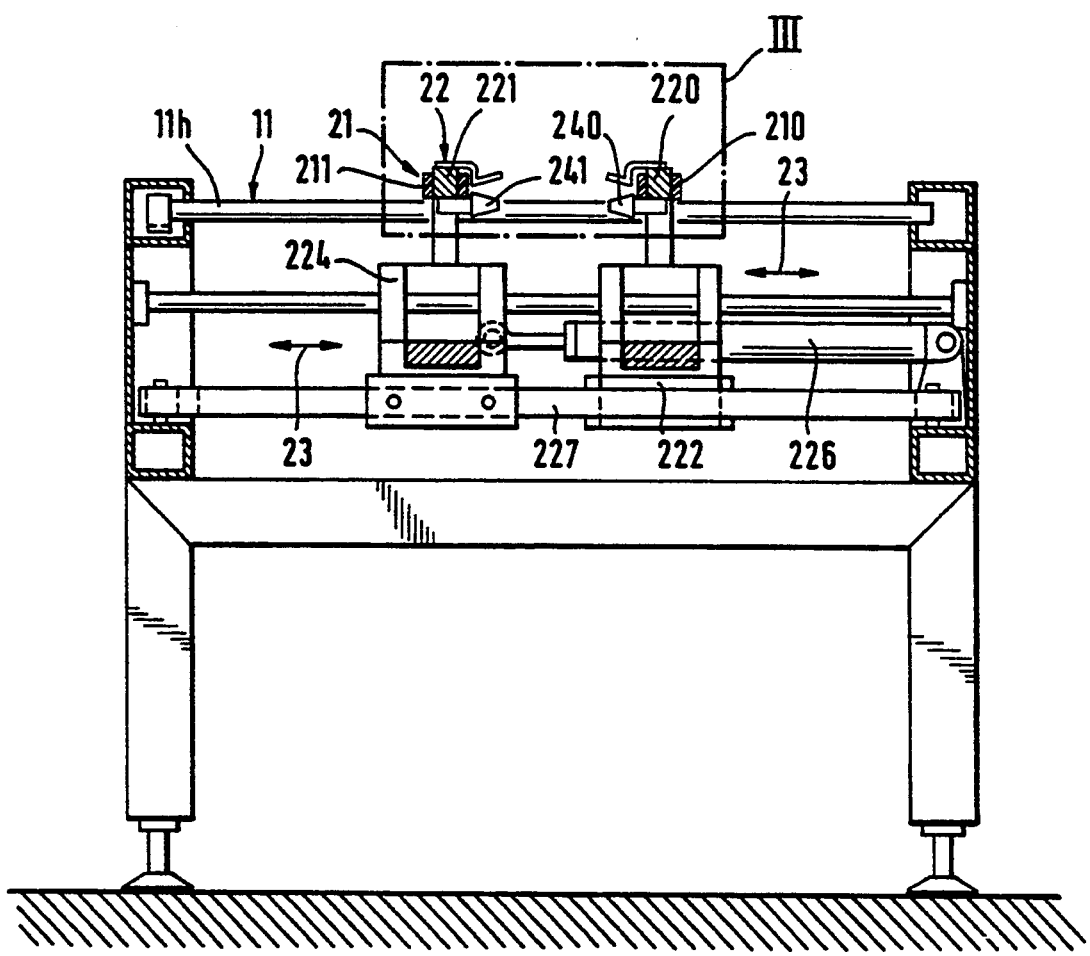
FIG. 2 is a section along the line II—II of FIG. 1.

The alignment and the transfer process of a board P from the first transport means, that is to say, from the roller conveyor 11, to the second transport means 21, will now be explained with reference to FIG. 2 and FIG. 3. The transfer of the board P takes place simultaneously with its alignment, as already mentioned above. For that purpose, the straightening bars 220 and 221, each of which is connected to two slides 222 and 223, and 224 and 225, respectively, are moved towards one another. That displacement of the straightening bars 220 and 221 is advantageously effected symmetrically, that is to say, the straightening bars 220 and 221 are moved symmetrically from their starting position towards one another (and later away from one another again). One possible method of effecting such a symmetrical displacement of the straightening bars 220 and 221 will become clear on considering FIG. 1 and FIG. 2 at the same time. For that purpose, a hydraulic or pneumatic system 226 is provided which moves one of the slides, for example slide 224, and with it the straightening bar 221, inwards from the starting position (that is to say, right at the outside), that is to say, towards the other straightening bar 220. Because all of the slides 222, 223, 224 and 225 are securely connected to an endless belt 227 in the manner shown in FIG. 1, the displacement of one slide, for example slide 224, causes all of the slides to be displaced symmetrically.

FIG. 3 shows the cut-out portion III of FIG. 2 again on an enlarged scale. The cut-out portion shows especially clearly how the transfer of the board P from the roller conveyor 11 (FIG. 1) to the second transport means 21 is effected. For that purpose, the roller 11$h$ is shown to represent the roller conveyor 11. The boards P to be coated are transported on that roller conveyor 11. When the board P has reached the curtain coating device 2, which state can be ascertained, for example, by means of a detector (not shown) which detects the board, the two straightening bars 220 and 221 are moved towards one another in the direction of arrows 23 in the manner already described above. In the region where the boards P coming from the roller conveyor 11 enter between the straightening bars 220 and 221, conical rollers, of which only the two conical rollers 240 and 241 are shown in FIG. 3, are arranged along the straightening bars. The roller axes extend parallel to the direction of movement 23 of the straightening bars 220 and 221. The roller conveyor 11 (FIG. 1) defines a first transport plane in which the boards P are transported. If the straightening bars are moved towards one another, the board P is moved via the envelopes 240$a$ and 241$a$ and thus lifted from that first transport plane. The further movement of the straightening bars 220 and 221 towards one another causes the board P to be moved further via the envelopes 240$a$ and 241$a$ of the conical rollers 240 and 241 until it slides into the longitudinal grooves 210$a$ and 211$a$ of the conveyor belts 210 and 211, respectively. Retaining bars 228 and 229 may be provided to prevent the board P from "breaking out" in the upward direction. Each of the conveyor belts 210 and 211 runs round its associated straightening bar 220 and 221, respectively, in the longitudinal direction. The plane of each conveyor belt 210 and 211 extends substantially perpendicular to the transport plane of the board. Thus, when the board P reaches the conveyor belts 210 and 211, the course of which defines a second transport plane, that transfer process has, as it were, transferred the board P from a first transport plane (roller conveyor) via an inclined plane (envelope of the conical rollers) onto a second transport plane (conveyor belts) that extends above the first transport plane and parallel thereto. That lifting from the roller conveyor 11 and the transfer to the conveyor belts 210 and 211 is very advantageous because the boards are moved through the pouring curtain 200 (FIG. 4) at a markedly greater speed than the speed at which they are transported by the roller conveyor 11. As a result, the drives of the two transport means can operate separately and, in addition, it is thus ensured that there is a certain time "buffer" between two consecutive boards P on the roller conveyor 11. The force with which the conveyor belts engage at the edges of the board P may be adjustable by means of the hydraulic or pneumatic system 226 and can accordingly be adapted to the board material concerned.

When the board P has slid into the longitudinal grooves 210$a$ and 211$a$ of the conveyor belts 210 and 211 and the latter engage at the board edges with the force adjusted, the actual coating operation begins. For that purpose, the board is moved through the pouring curtain 200 which falls from the curtain pouring head 20, as shown in FIG. 4. Connected to the straightening bars 220 and 221 are limiting members which may be in the form of pouring blades 250 and 251 of conventional type. Such pouring blades and the basic process of curtain coating are described, for example, in EP-A-145 648. Those limiting members (pouring blades) serve to delimit the effective width of the coating curtain 200 which strikes the board P to be coated. As shown in FIG. 4, in the embodiment described, the pouring blades 250 and 25 1 are connected securely to the straightening bars 220 and 221 so that, when the straightening bars 220 and 221 move, the pouring blades 250 and 251 are always moved with them in corresponding manner. This is especially advantageous because, in that manner, the effective width of the pouring curtain 200 is established simultaneously with the displacement of the straightening bars 220 and 221 in such a manner that the effective curtain width is matched to the width of the board P transported by the conveyor belts 210 and 211. It can be seen from FIG. 4 that the pouring blades 250 and 251 are so secured to the straightening bars that the pouring curtain 200 strikes the board P to be coated over its entire width, with the exception of a narrow border region near the side edges of the board P. That establishment of the effective curtain width is advantageous because the conveyor belts 210 and 211 are thus completely protected from the falling coating composition (for example resist) and remain unsoiled, that is to say, on the one hand the board edges and board borders remain uncoated and, on the other, the conveyor belts 210 and 211 do not have to be constantly cleaned. As a result, the requirement of cleaning the conveyor belts and the associated complication of installing and removing the belts are avoided. The remainder of the pouring curtain 200, which falls outside the effective curtain width delimited by the pouring blades 250 and 251 is conveyed via deflector plates 252 and 253 to a collecting tank 254.

When the board P has been coated in the manner described, it can be transferred, for example, to the roller conveyor 31 (FIG. 1) and transferred in the direction of arrow T2, for example, to a drying device (not shown). The straightening bars 220 and 221 are then moved back in the direction of arrows 23 into their starting position (outwards) and the next board P can enter in the same manner from the roller conveyor 11 and be transferred in the manner described to the conveyor belts 210 and 211 (FIG. 3).

As an additional development, the coating apparatus according to the invention or its second transport means 21 may comprise a further conveyor belt or two further conveyor belts 260 and 261, which are shown in FIG. 1. Those conveyor belts 260 and 261 are arranged approximately in the second transport plane which is defined by the lateral conveyor belts 210 and 211 (or by their longitudinal grooves 210a and 211a) and run in the direction of transport of the board. They are used to support boards of relatively great width, which tend to sag in the middle owing to their own weight, so that, as the board P is conveyed through the curtain, no "trough effect" occurs with all of the resist running into the middle of the board. It will be understood that the speed at which the belts 260 and 261 circulate corresponds to the speed of transport at which the conveyor belts 210 and 211 move the board P through the pouring curtain 200. In that development, the straightening bars 220 and 221 can be displaced symmetrically in relation to those further conveyor belts 260 and 261 so that the middle of the board also is supported by the additional belts 260 and 261.

A further embodiment of the curtain coating device 2 is shown in FIG. 5. For reasons of symmetry, only one conveyor belt 211 is shown there. This Figure shows that the conveyor belt 211, viewed in the direction of transport, is moved outwards away from the side edge of the board P just upstream of the pouring curtain (the curtain falls where the pouring blade 251 is indicated). That operation is effected by means of a deflecting device 271 which guides the conveyor belt 211 back to the side edge of the board P just downstream of the pouring curtain. So that the conveyor belt 211 remains taut and releases the side edge of the board P only just upstream of the pouring curtain and only for the short distance under the pouring curtain, another guide cylinder or guide roller 272 is provided just upstream of the deflecting device 271. Accordingly, a further guide roller 273 is provided downstream of the deflecting device 271 so that the conveyor belt 211 engages at the side edge of the board P again just downstream of the pouring curtain.

Thus a state can be achieved where the falling pouring curtain strikes the board P over its entire width without leaving the border of the board uncoated and without the conveyor belts being soiled. The section along the line VI—VI in FIG. 5, which is shown in FIG. 6, shows this clearly. There, the position of the pouring blade 251 in which the side border of the board P is not coated is shown with faint lines and the position of the pouring blade 251 in which the board P is coated over its entire width is shown with bold lines. In order to guide the board P into the groove 21 1a of the conveyor belt 211, there is provided at the deflecting device 271 a corresponding conically tapering guide 271a, as shown clearly in FIG. 7.

FIG. 8 shows a further embodiment of the curtain coating device 2 (FIG. 1). Them, two separate conveyor belts, an incoming belt 212 and an outgoing belt 213, are provided instead of an endless conveyor belt 211. As a result, it is not necessary to deflect the conveyor belt in the region of the pouring curtain and the board P can nevertheless be coated over its entire width. In this case too, the board P is released at its side edge from the incoming conveyor belt 212 shortly before reaching the pouring curtain (in FIG. 8 the position of the pouring blade 251 is shown for that purpose) and is re-engaged by the outgoing conveyor belt 213 just downstream of the pouring curtain. In that embodiment, a conically tapering guide 271b is provided, as shown again more clearly in FIG. 9, in order to guide the board P into the groove of the outgoing conveyor belt 213. In that embodiment, it is necessary for the speed of the two conveyor belts 212 and 213 to be the same. For that purpose they may be driven, for example, in synchronised manner.

The coating apparatus according to the invention is especially suitable for the coating of printed circuit boards with UV-hardenable plastics or resistes of any type, for example with solder resist, but other types of coating composition are, of course, also possible. The apparatus is particularly compact and thus, especially, enables space to be saved in comparison with known apparatuses, which, in an age where space is increasingly at a premium, is especially advantageous. In addition, in the case of the apparatus according to the invention, several working steps (alignment, measurement and transfer of the boards) are carried out in one step, which, in addition to the saving of space, can also give a time advantage. Furthermore, during the coating operation, the boards to be coated do not rest on conveyor belts as do boards in the known apparatuses, so that the quality of the contact face cannot be impaired, or damage to the contact face can be avoided. That is of great advantage especially when, after coating one face of the board and after subsequently drying and turning the board over onto the other side, which had previously been the contact face, the board is coated again, in other words when both sides of the board are to be coated. The manner of transport is also important because, in that manner, no traces of resist can reach the conveyor belts on which the board rests, for example through drill-holes in a blank, as is the case with known apparatuses. The conveyor belts cannot be soiled, or, at most, can be soiled only very slightly, which considerably reduces cleaning requirements and thus distinctly increases the availability of the apparatus. The apparatus as a whole is especially suitable as a component part of complete coating installations which comprise, in addition to board conveyance and the actual coating operation, also a vapor-removal station, a drying station and, for the commonly occurring cases where the boards are to be coated on both sides, also a turning station and, optionally, returning means that return the boards to the coating apparatus where then the second board face can be coated. The installation can, of course, alternatively have a series structure, that is to say, the board which has been coated on one side is subjected to vapor-removal and is dried, turned over and conveyed to an additional, second coating apparatus which is arranged "in series".

What is claimed is:

1. A coating apparatus for boards or rectangular workpieces that are to be coated with a coating composition, the apparatus comprising:

first transport means for transporting the boards to be coated;

aligning means that so align the boards to be coated that, after alignment, their side edges are arranged approximately parallel to the direction of transport of the board, wherein the aligning means comprise two straightening members that are arranged laterally approximately parallel to the direction of transport of the boards, which straightening members can be moved towards or away from one another substantially perpendicular direction of transport; and a curtain coating device in which are provided second transport means that transport the boards coming from the first transport means under a curtain pouring head provided in the curtain coating device, which curtain pouring head is so arranged that the falling pouring curtain strikes the board along a line of impact extending transversely to the direction of transport of the board and thus coats that board, wherein the speed with which the first transport means transports the boards is significantly different from the speed with which the second transport means transports the boards under the curtain pouring head, and wherein the aligning means are designed such and are so arranged that, as they align the boards, they transfer them from the first transport means to the second transport means, and wherein the straightening members are connected to transfer means, each of which defines an inclined plane that extends between a first transport plane that is defined by the first transport means and a second transport plane that is defined by the second transport means and extends substantially parallel to and above the first transport plane, and the transfer means lift the boards from the first transport means and transfer them via the inclined plane to the second transport means.

2. A coating apparatus according to claim 1, wherein the straightening members can be moved towards or away from one another symmetrically.

3. A coating apparatus according to claim 1, wherein the transfer means comprise free-running conical rollers that, in the region in which the boards coming from the first transport means enter between the straightening members are so arranged along the straightening members that the roller axes extend parallel to the direction of movement of the straightening members so that the straightening members by their movement towards one another, move the boards via the conical rollers and transfer them to the second transport means.

4. A coating apparatus according to claim 1, wherein the straightening members comprise straightening bars and the second transport means comprise drivable conveyor belts each of which is arranged in the direction of transport to run round its associated straightening bar, the plane of each conveyor belt extending substantially perpendicular to the transport plane of the board and the conveyor belts engaging at the side edges of the boards when the latter are being transported.

5. A coating apparatus according to claim 4, the conveyor belts comprise a longitudinal groove in which the conveyor belt engages at the associated side edge of the board.

6. A coating apparatus according to claim 1, wherein there are connected to the straightening members limiting members for the lateral delimitation of the pouring curtain, which limiting members can be displaced together with the straightening members.

7. A coating apparatus according to claim 6, wherein the limiting members for the lateral delimitation of the pouring curtain are so arranged that the falling pouring curtain does not strike the board in a narrow border region near the side edge of the board.

8. A coating apparatus according to claim 6, wherein the limiting members for the lateral delimitation of the pouring curtain are so arranged that the falling pouring curtain strikes the board over its entire width.

9. A coating apparatus according to claim 8, wherein there is arranged in the region of the falling pouring curtain a deflecting device which, a short distance upstream of the pouring curtain, viewed in the direction of transport, guides the conveyor belts outwards and away from the side edges of the board, around the deflecting device, and, a short distance downstream of the pouring curtain, guides them back again to the side edges of the board.

10. A coating apparatus according to claim 2, wherein the second transport means comprise a support belt or two support belts that are arranged in the direction of transport approximately in the second transport plane defined by the second transport means, and the straightening members can be displaced towards or away from one another symmetrically in relation to that(those) conveyor belt(s).

11. An apparatus according to claim 1, wherein the boards are printed circuit boards, and wherein the coating composition is comprised of UV-hardenable plastics or a resist.

* * * * *